(12) United States Patent
Nakazawa et al.

(10) Patent No.: US 12,224,303 B2
(45) Date of Patent: Feb. 11, 2025

(54) MANUFACTURING METHOD OF PHOTOELECTRIC CONVERSION PANEL, PHOTOELECTRIC CONVERSION PANEL, AND X-RAY PANEL

(71) Applicant: Sharp Display Technology Corporation, Kameyama (JP)

(72) Inventors: Makoto Nakazawa, Kameyama (JP); Hiroyuki Moriwaki, Kameyama (JP); Rikiya Takita, Kameyama (JP); Tetsuya Tanishima, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 142 days.

(21) Appl. No.: 18/197,117

(22) Filed: May 15, 2023

(65) Prior Publication Data

US 2023/0387177 A1 Nov. 30, 2023

(30) Foreign Application Priority Data

May 24, 2022 (JP) ................. 2022-084818

(51) Int. Cl.
*H01L 27/146* (2006.01)
*G01T 1/20* (2006.01)

(52) U.S. Cl.
CPC ...... *H01L 27/14689* (2013.01); *G01T 1/2018* (2013.01); *H01L 27/14636* (2013.01); *H01L 27/14663* (2013.01)

(58) Field of Classification Search
CPC ......... H01L 27/14689; H01L 27/14636; H01L 27/14663; H01L 27/14612; H01L 27/14692; G01T 1/2018
See application file for complete search history.

(56) References Cited

U.S. PATENT DOCUMENTS

| | | | |
|---|---|---|---|
| 2004/0147068 A1* | 7/2004 | Toyoda ............. | H01L 27/14643 438/197 |
| 2006/0077308 A1* | 4/2006 | Mochizuki ............. | H04N 25/76 348/800 |
| 2010/0091149 A1* | 4/2010 | Weisfield .......... | H01L 27/14698 348/294 |
| 2011/0127593 A1 | 6/2011 | Hayashi | |
| 2012/0061578 A1* | 3/2012 | Lim ................... | H01L 27/14663 250/370.14 |
| 2014/0231804 A1* | 8/2014 | Yan .................... | H01L 27/14603 257/53 |
| 2015/0008429 A1* | 1/2015 | Ito ..................... | H01L 23/53238 257/43 |
| 2019/0198557 A1* | 6/2019 | Yang ....................... | G01T 1/241 |

(Continued)

FOREIGN PATENT DOCUMENTS

JP 2011-114310 A 6/2011

*Primary Examiner* — Kiho Kim
(74) *Attorney, Agent, or Firm* — ScienBiziP, P.C.

(57) ABSTRACT

In a manufacturing method of a photoelectric conversion panel, a contact hole CH3 that exposes a part of an upper face of a photodiode and a contact hole CH2 that exposes a source connection electrode are formed in a first flattening film and in inorganic insulating films 105a to 105c, an inorganic insulating film 107 is formed, contact holes CH2*a* and CH3*a* are formed in the contact holes CH2 and CH3, respectively, and a bias line and a data line are formed in the contact holes CH2*a* and CH3*a*, respectively.

6 Claims, 18 Drawing Sheets

(56) References Cited

U.S. PATENT DOCUMENTS

2019/0198558 A1* 6/2019 Jeon .................. H01L 27/14663
2019/0245002 A1* 8/2019 Misaki .............. H01L 27/14612
2020/0043973 A1* 2/2020 Misaki .............. H01L 27/14692
2021/0111218 A1* 4/2021 Nakamura ........ H01L 27/14663

* cited by examiner

MANUFACTURING METHOD OF PHOTOELECTRIC CONVERSION PANEL, PHOTOELECTRIC CONVERSION PANEL, AND X-RAY PANEL

CROSS-REFERENCE TO RELATED APPLICATIONS

This application claims the benefit of priority to Japanese Patent Application Number 2022-084818 filed on May 24, 2022. The entire contents of the above-identified application are hereby incorporated by reference.

BACKGROUND

Technical Field

The disclosure relates to a manufacturing method of a photoelectric conversion panel, a photoelectric conversion panel, and an X-ray panel.

In the related art, a manufacturing method of a photoelectric conversion panel, a photoelectric conversion panel, and an X-ray panel have been known. Such a manufacturing method of a photoelectric conversion panel, a photoelectric conversion panel, and an X-ray panel are disclosed in, for example, JP 2011-114310 A.

The photoelectric conversion device disclosed in JP 2011-114310 A includes a thin film transistor formed on a substrate, a photodiode electrically connected to the thin film transistor, a bias line, and a data line. The photoelectric conversion device also includes a passivation film that covers the photodiode and the thin film transistor. The passivation film is provided with a first hole portion in which a part of the bias line is disposed and inside which the bias line and the photodiode are connected to each other. In addition, the passivation film is provided with a second hole portion in which a part of the data line is disposed and inside which the data line and a source electrode of the thin film transistor are connected to each other. The bias line is provided above the photodiode, and thus a height position of an upper face of the bias line is higher than a height position of an upper face of the data line.

SUMMARY

In the photoelectric conversion device disclosed in JP 2011-114310 A, the height position of the upper face of the data line is lower than the height position of the upper face of the bias line. Thus, in a passivation film, an upper end of the second hole portion in which a part of the data line is formed is lower than an upper end of the first hole portion in which a part of the bias line is formed. Accordingly, since the upper end of the second hole portion is low, providing a recess (space) in a periphery of the second hole portion is required. As a result, the amount of exposure required for photolithography when forming the passivation film increases. In addition, with the recess coming close to a side surface of the photodiode, plasma damage (damage due to discharge) may occur in the photodiode.

Thus, it is conceivable to provide the photoelectric conversion device with a flattening film that levels the height position of the place where the photodiode is disposed and the height position of the place where the photodiode is not disposed. As a result, the plasma damage can be prevented and an interval between pixels can be reduced, allowing the number of pixels of the photoelectric conversion panel to be increased. However, in this case, since the second hole portion needs to be deep, the etching time for forming the first hole portion and the second hole portion gets extended. As a result, in the first hole portion, a portion to have been originally left gets removed by the etching, causing a contact failure to occur or an increase in contact resistance to occur between the bias line disposed in the first hole portion and the photodiode.

Thus, the disclosure has been made to solve the above-described problems, and an object of the disclosure is to provide a manufacturing method of a photoelectric conversion panel, a photoelectric conversion panel, and an X-ray panel, in which even when the flattening film that covers the photodiode is provided, the contact failure or the increase in contact resistance between the bias line and the photodiode can be prevented.

To solve the above problem, a manufacturing method of a photoelectric conversion panel according to a first aspect of the disclosure includes forming a transistor on a substrate, forming a photodiode at an upper layer overlying the transistor, forming a first insulating film that covers the photodiode, forming a first flattening film that covers the first insulating film, forming a first hole portion that exposes a part of an upper face of the photodiode in the first flattening film and the first insulating film, forming a second hole portion that exposes a source electrode of the transistor or a connection electrode connected to the source electrode in the first flattening film and the first insulating film, forming a second insulating film that covers the first flattening film, a part of the second insulating film being disposed in each of the first hole portion and the second hole portion, forming a third hole portion in the second insulating film disposed in the first hole portion, forming a fourth hole portion in the second insulating film disposed in the second hole portion, forming a bias line at an upper layer overlying the second insulating film, a part of the bias line being disposed in the third hole portion, and forming a data line at an upper layer overlying the second insulating film, a part of the data line being disposed in the fourth hole portion.

A photoelectric conversion panel according to a second aspect includes a substrate, a transistor formed on the substrate, a photodiode formed at an upper layer overlying the transistor, a first insulating film that covers the photodiode, a first flattening film that covers the first insulating film, a second insulating film that covers the first flattening film, a bias line formed at an upper layer overlying the second insulating film; and a data line formed at an upper layer overlying the second insulating film, in which each of the first flattening film and the first insulating film includes a first hole portion connected to an upper face of the photodiode and a second hole portion connected to a source electrode of the transistor or a connection electrode connected to the source electrode, a part of the second insulating film is disposed in each of the first hole portion and the second hole portion, a portion of the second insulating film disposed in the first hole portion includes a third hole portion, a portion of the second insulating film disposed in the second hole portion includes a fourth hole portion, a part of the bias line is disposed in the third hole portion, and a part of the data line is disposed in the fourth hole portion.

A X-ray panel according to a third aspect includes a scintillator that fluoresces by being irradiated with X-rays, a substrate, a transistor formed on the substrate, a photodiode that converts light from the scintillator into an electric signal, the photodiode being formed at an upper layer overlying the transistor, a first insulating film that covers the photodiode, a first flattening film that covers the first insulating film, a second insulating film that covers the first flattening film, a bias line formed at an upper layer overlying the second insulating film, and a data line formed at an upper layer overlying the second insulating film, in which each of the first flattening film and the first insulating film includes a first hole portion connected to an upper face of the photodiode and a second hole portion connected to a source electrode of the transistor or a connection electrode connected to the source electrode, a part of the second insulating film is disposed in each of the first hole portion and the second hole portion, a portion of the second insulating film disposed in the first hole portion includes a third hole portion, a portion of the second insulating film disposed in the second hole portion includes a fourth hole portion, a part of the bias line is disposed in the third hole portion, and a part of the data line is disposed in the fourth hole portion.

According to the above configuration, a step of forming the first hole portion and the second hole portion in the first insulating film and a step of forming the third hole portion and the fourth hole portion in the second insulating film are performed in different steps, and thus a burden due to etching of the first hole portion and the third hole portion can be dispersed for each step as compared with a case where the hole portions are formed in the first insulating film and the second insulating film at one time. As a result, the portion to have been originally left in the first hole portion can be prevented from being removed by etching. As a result, even when the flattening film that covers the photodiode is provided, a contact failure or an increase in contact resistance between the bias line and the photodiode in the first hole portion and the third hole portion can be prevented.

BRIEF DESCRIPTION OF DRAWINGS

The disclosure will be described with reference to the accompanying drawings, wherein like numbers reference like elements.

FIG. 11 is a view for describing formation of contact holes CH2a and CH3a.

DESCRIPTION OF EMBODIMENTS

Figure 1:
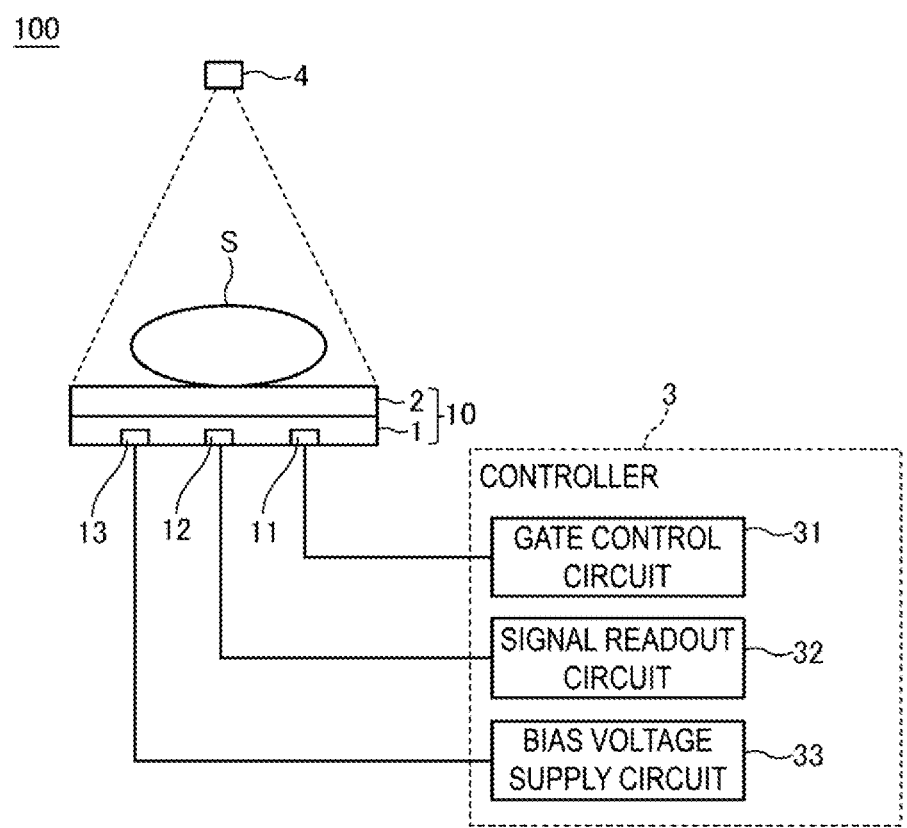
FIG. 1 is a schematic view illustrating an X-ray imaging device 100 provided with an X-ray panel 10 including a photoelectric conversion panel 1 according to a first embodiment.

Embodiments of the disclosure will be described below with reference to the drawings. Note that the disclosure is not limited to the following embodiments, and appropriate design changes can be made within a scope that satisfies the configuration of the disclosure. Further, in the description below, the same reference signs are used in common among the different drawings for portions having the same or similar functions, and descriptions of repetitions thereof will be omitted. Further, the configurations described in the embodiments and the modified examples may be combined or modified as appropriate within a range that does not depart from the gist of the disclosure. Further, for ease of explanation, in the drawings referenced below, the configuration is simplified or schematically illustrated, or a portion of the components are omitted. Further, dimensional ratios between components illustrated in the drawings are not necessarily indicative of actual dimensional ratios.

First Embodiment

Configuration of X-Ray Imaging Device 100

FIG. 1 is a schematic view illustrating an X-ray imaging device 100 provided with an X-ray panel 10 including a photoelectric conversion panel 1 according to a first embodiment. The X-ray imaging device 100 is provided with the X-ray panel 10 including the photoelectric conversion panel 1 and a scintillator 2, a control unit 3, and an X-ray source 4.

As illustrated in FIG. 1, the control unit 3 includes a gate control circuit 31, a signal readout circuit 32, and a bias voltage supply circuit 33. The gate control circuit 31 is connected to a gate terminal 11 of the photoelectric conversion panel 1. The signal readout circuit 32 is connected to a data terminal 12. The bias voltage supply circuit 33 is connected to a bias terminal 13.

The X-ray source 4 irradiates a subject S with X-rays. X-rays passing through the subject S are converted into fluorescence (hereinafter, referred to as "scintillation light") in the scintillator 2 disposed at an upper portion of the photoelectric conversion panel 1. The X-ray imaging device 100 generates an X-ray image by imaging the scintillation light in the X-ray panel 10.

Figure 2:
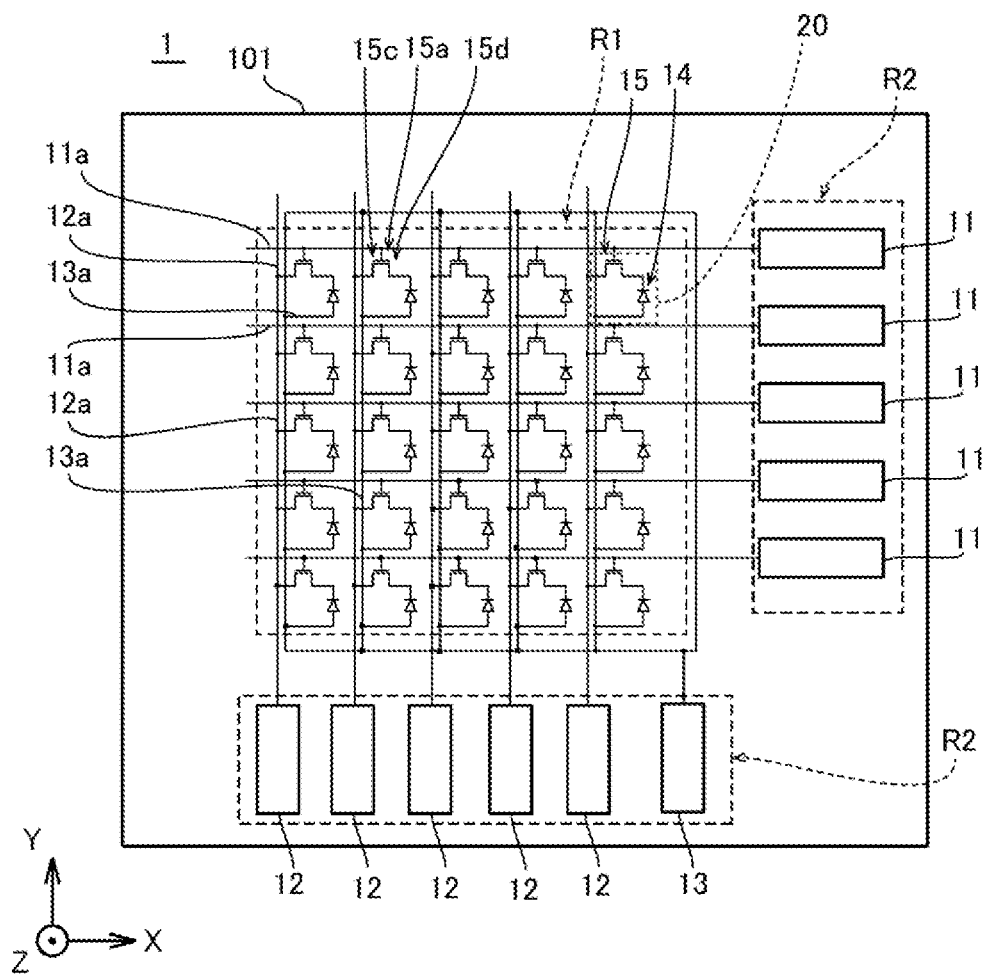
FIG. 2 is a schematic plan view illustrating a schematic configuration of the photoelectric conversion panel 1.

FIG. 2 is a schematic plan view illustrating a schematic configuration of the photoelectric conversion panel 1. The photoelectric conversion panel 1 includes a plurality of the gate terminals 11, a plurality of the data terminals 12, the bias terminal 13, a plurality of photodiodes 14, and a plurality of thin film transistors (TFTs) 15. Further, a plurality of gate lines 11a, a plurality of data lines 12a, and a plurality of bias lines 13a are formed on a substrate 101 of the photoelectric conversion panel 1.

Each of the plurality of gate lines 11a connects gate electrodes 15a of the plurality of TFTs 15 to a respective one of the plurality of gate terminals 11. Each of the plurality of data lines 12a connects source electrodes 15c of the plurality of TFTs 15 to a respective one of the plurality of data terminals 12. The bias line 13a connects the bias terminal 13 to the plurality of photodiodes 14.

As illustrated in FIG. 2, the photoelectric conversion panel 1 is provided with a pixel region R1 and terminal regions R2. The pixel region R1 has, for example, a rectangular shape in a plan view. The pixel region R1 is a region in which a plurality of pixels 20 are formed. The pixel 20 is a region defined by the gate line 11a and the data line 12a. The terminal regions R2 are respectively provided on a positive side in an X direction and on a negative side in a Y direction of the pixel region R1, and are regions where the gate terminals 11, data terminals 12, and bias terminal 13 are disposed.

As illustrated in FIG. 2, in the pixel region R1, the plurality of gate lines 11a and the plurality of data lines 12a are formed so as to intersect each other. As a result, the plurality of pixels 20 are formed in a matrix shape in a plan view. The photoelectric conversion panel 1 includes an active matrix substrate. The bias line 13a is formed, for example, along the data line 12a. Each of the pixels 20 is provided with a respective one of the plurality of photodiodes 14 and a respective one of the plurality of TFTs 15. In other words, the pixel region R1 is an active region.

As illustrated in FIG. 2, in the terminal region R2, the plurality of gate terminals 11 are disposed side by side in the Y direction. Further, in the terminal region R2, the plurality of data terminals 12 and the bias terminal 13 are disposed side by side in the X direction. Each of the plurality of gate terminals 11 transmits a gate signal from the gate control circuit 31 to a respective one of the plurality of gate lines 11a. Each of the plurality of data terminals 12 applies a read voltage from the signal readout circuit 32 to a respective one of the plurality of data lines 12a. Each of the plurality of data terminals 12 obtains data signals from the photodiodes 14 via a respective one of the data lines 12a and the TFTs 15, and transmits the data signals to the signal readout circuit 32. The bias terminal 13 supplies a bias voltage from the bias voltage supply circuit 33 to the bias lines 13a.

The control unit 3 illustrated in FIG. 1 emits X-rays from the X-ray source 4 and generates the X-ray image based on the data signals obtained by the signal readout circuit 32. In a state in which the bias voltage is applied from the bias line 13a to the photodiode 14, the photodiode 14 converts the X-rays transmitted through the subject S into electric charges corresponding to a light amount of the scintillation light converted by the scintillator, and transmits a signal (data signal) corresponding to the electric charges to the TFT 15. Then, the control unit 3 causes the gate control circuit 31 to sequentially and selectively supply the gate signal to each gate line 11a. The TFT 15 to which the gate signal is supplied is turned on. The readout voltage is applied to the data line 12a by the signal readout circuit 32, and when the TFT 15 is turned on, the signal (data signal) corresponding to the electric charges converted in the photodiode 14 is applied to the readout voltage. Then, the signal readout circuit 32 obtains the data signal. The control unit 3 generates the X-ray image based on the data signal of each pixel 20 in the pixel region R1.

Configuration of Photoelectric Conversion Panel 1

Figure 3:
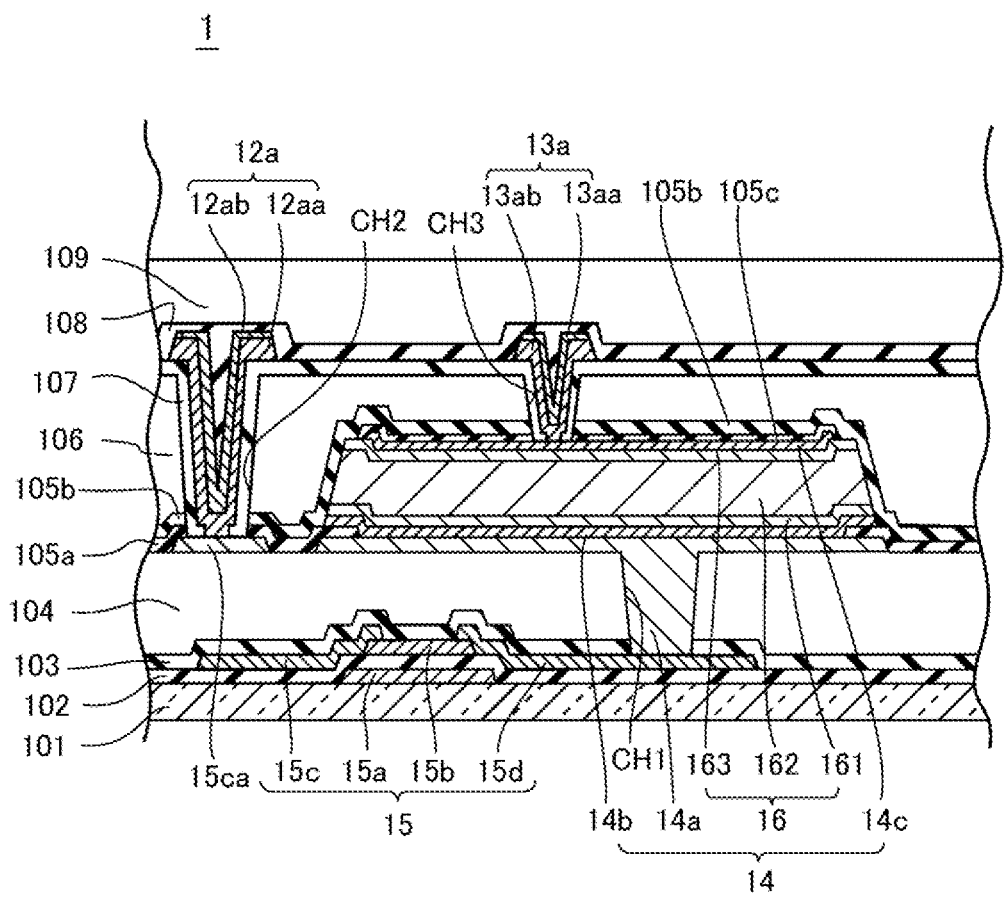
FIG. 3 is a cross-sectional view illustrating a configuration of the photoelectric conversion panel 1.

A configuration of the photoelectric conversion panel 1 will be described with reference to FIG. 3. FIG. 3 is a cross-sectional view illustrating the configuration of the photoelectric conversion panel 1. As illustrated in FIG. 3, the thin film transistor 15 of the photoelectric conversion panel 1 includes the gate electrode 15a connected to the gate line 11a (see FIG. 2), a semiconductor active layer 15b, the source electrode 15c connected to the data line 12a, and a drain electrode 15d connected to the photodiode 14. The photodiode 14 includes a photoelectric conversion layer 16, a cathode 14b, and an anode 14c. The photoelectric conversion layer 16 is provided between the cathode 14b and the anode 14c. The drain electrode 15d and the cathode 14b are connected to each other via a cathode connection electrode 14a provided in a contact hole CH1.

A part of the data line 12a is disposed in a contact hole CH2 and is connected to a source connection electrode 15ca via the contact hole CH2. The data line 12a includes a data lower electrode 12aa and a data upper electrode 12ab that covers the data lower electrode 12aa. The bias line 13a includes a bias lower electrode 13aa, a part of which is formed in a contact hole CH3, and a bias upper electrode 13ab formed on the bias lower electrode 13aa. The bias line 13a is connected to the anode 14c of the photodiode 14 in the contact hole CH3. Note that although not illustrated in FIG. 3, the source electrode 15c is connected to the data line 12a via the source connection electrode 15ca.

As illustrated in FIG. 3, the gate electrode 15a is formed on the substrate 101. The substrate 101 is, for example, a glass substrate with an insulating property. The gate electrode 15a is formed as a layered film containing tungsten (W) and tantalum nitride (TaN), for example, as materials. A gate insulating film 102 is provided so as to cover the gate electrode 15a. The gate insulating film 102 is formed by layering an insulating film formed of silicon oxide ($SiO_2$) as an upper layer and an insulating film formed of silicon nitride ($SiN_x$) as a lower layer.

The semiconductor active layer 15b, and the source electrode 15c and the drain electrode 15d that are connected to the semiconductor active layer 15b, are formed on the gate electrode 15a with the gate insulating film 102 being interposed therebetween. The semiconductor active layer 15b is formed of an oxide semiconductor. The oxide semiconductor is, for example, an amorphous oxide semiconductor containing indium (In), gallium (Ga) and zinc (Zn) in a predetermined ratio. According to this configuration, an off-leak current of the thin film transistor 15 can be reduced as compared with amorphous silicon (a-Si). When the off-leak current of the thin film transistor 15 is small, a sensor panel with high sensitivity can be obtained, and the photoelectric conversion panel 1 with low exposure can be obtained. Note that the semiconductor active layer 15b is not limited to this, and may contain $InGaO_3$ $(ZnO)_5$, magnesium zinc oxide ($Mg_xZn_{1-x}O$), cadmium zinc oxide ($Cd_xZn_{1-x}O$), cadmium oxide (CdO), InSnZnO (indium (In), tin (Sn), and zinc (Zn)), and an indium (In)-aluminum (Al)-zinc (Zn)-oxygen(O) based amorphous oxide semiconductor or the like may be used. As the oxide semiconductor, an "amorphous" material or a "crystalline (including polycrystalline, microcrystalline, and c-axis aligned)" material can be used.

The source electrode 15c and the drain electrode 15d are disposed so as to be in contact with a part of the semiconductor active layer 15b on the gate insulating film 102. Also, the source electrode 15c and the drain electrode 15d are formed on the same layer. The source electrode 15c and the drain electrode 15d have a triple-layer structure layered such that two metal films made of titanium (Ti) sandwich a metal film made of aluminum (Al), for example.

As illustrated in FIG. 3, a protection film 103 is provided so as to cover the source electrode 15c and the drain electrode 15*d* on the gate insulating film 102. In the protection film 103, the contact hole CH1 is formed on the drain electrode 15*d*. The protection film 103 is formed of, for example, silicon oxide ($SiO_2$).

A second flattening film 104 is provided at an upper layer of the protection film 103. In other words, the second flattening film 104 is formed at an upper layer overlying the thin film transistor 15. Accordingly, the second flattening film 104 covers at least a part of the thin film transistor 15 and levels an upper portion of the thin film transistor 15. Further, the second flattening film 104 includes the contact hole CH1 provided on the drain electrode 15*d*. The second flattening film 104 is formed of an organic insulating film containing a resin material (organic material).

The cathode connection electrode 14*a* is formed at an upper layer of the second flattening film 104. The cathode connection electrode 14*a* is formed in the contact hole CH1 and connects the drain electrode 15*d* to the cathode 14*b*. The cathode connection electrode 14*a* has a triple-layer structure layered such that two metal films made of titanium (Ti) sandwich a metal film made of aluminum (Al), for example. Here, aluminum is contained in the cathode connection electrode 14*a* and aluminum has a relatively small electric resistance value, and thus the electric resistance value of the cathode connection electrode 14*a* becomes relatively low. Note that the source connection electrode 15*ca* is formed at an upper layer of the second flattening film 104 and in the same layer as the cathode connection electrode 14*a*.

An inorganic insulating film 105*a* is formed at an upper layer of the cathode connection electrode 14*a* and the source connection electrode 15*ca*. In the inorganic insulating film 105*a*, the contact hole CH2 is provided on the source connection electrode 15*ca*, and in the contact hole CH2, a part of the data lower electrode 12*aa* and the data upper electrode 12*ab* are provided. The inorganic insulating film 105*a* is formed of silicon nitride ($SiN_x$), or silicon dioxide ($SiO_2$), for example.

The cathode 14*b* of the photodiode 14 is formed so as to cover a part of the inorganic insulating film 105*a* at an upper layer overlying the cathode connection electrode 14*a*. The cathode 14*b* and the cathode connection electrode 14*a* are in contact with each other. The cathode 14*b* is formed of, for example, titanium (Ti).

The photoelectric conversion layer 16 is formed at an upper layer of the cathode 14*b*. The photoelectric conversion layer 16 is formed by sequentially layering an n-type amorphous semiconductor layer 161, an intrinsic amorphous semiconductor layer 162, and a p-type amorphous semiconductor layer 163. The n-type amorphous semiconductor layer 161 is formed of amorphous silicon doped with n-type impurities (for example, phosphorus). The intrinsic amorphous semiconductor layer 162 is formed of intrinsic amorphous silicon. The intrinsic amorphous semiconductor layer 162 is formed so as to be in contact with the n-type amorphous semiconductor layer 161. The p-type amorphous semiconductor layer 163 is formed of amorphous silicon doped with p-type impurities (for example, boron). The p-type amorphous semiconductor layer 163 is formed so as to be in contact with the intrinsic amorphous semiconductor layer 162. The anode 14*c* is formed on the photoelectric conversion layer 16. the anode 14*c* is formed of, for example, indium tin oxide (ITO). Then, the inorganic insulating film 105*c* is formed so as to cover the anode 14*c*. In the inorganic insulating film 105*c*, the contact hole CH3 in which a part of the bias line 13*a* is provided is formed. The inorganic insulating film 105*c* is formed of silicon nitride ($SiN_x$), or silicon dioxide ($SiO_2$), for example.

The inorganic insulating film 105*b* is formed so as to cover at least a part of the photodiode 14 and the inorganic insulating film 105*a*. In addition, the inorganic insulating film 105*b* covers a part of the upper face of the photodiode 14 and the side surface of the photodiode 14. Furthermore, the contact holes CH3 and CH5 are formed in the inorganic insulating film 105*b*. The inorganic insulating film 105*b* is formed as an inorganic insulating film and formed of, for example, silicon nitride ($SiN_x$).

The first flattening film 106 is formed at an upper layer overlying the photodiode 14 so as to cover the inorganic insulating film 105*b*. The first flattening film 106 covers the photodiode 14, leveling a step portion formed by the photodiode 14. The first flattening film 106 is made of a material (organic insulating film) similar to that of the second flattening film 104, for example. Furthermore, the contact holes CH2 and CH3 are formed in the first flattening film 106.

The data lower electrode 12*aa* and the data upper electrode 12*ab* are layered in the contact hole CH2. The bias lower electrode 13*aa* and the bias upper electrode 13*ab* are layered in the contact hole CH3. The data line 12*a* and the source connection electrode 15*ca* are connected to each other in the contact hole CH2. The bias line 13*a* and the anode 14*c* of the photodiode 14 are connected to each other in the contact hole CH3. The data lower electrode 12*aa* and the bias lower electrode 13*aa* have a triple-layer structure layered such that two metal films made of titanium (Ti) sandwich a metal film made of aluminum (Al), for example. The data upper electrode 12*ab* and the bias upper electrode 13*ab* are formed of, for example, ITO.

An inorganic insulating film 107 is formed at an upper layer of the first flattening film 106, and a part thereof is disposed on an inner side surface of each of the contact hole CH2 and the contact hole CH3. An inorganic insulating film 108 is formed so as to cover the inorganic insulating film 107, the data line 12*a*, and the bias line 13*a*. In addition, the inorganic insulating films 107 and 108 are passivation films (protection films). The inorganic insulating films 107 and 108 are formed of silicon nitride ($SiN_x$), or silicon dioxide ($SiO_2$), for example.

A third flattening film 109 is formed so as to cover the inorganic insulating film 108. The third flattening film 109 levels a portion above the data line 12*a* and the bias line 13*a*. Further, the third flattening film 109 is made of a material (organic insulating film) similar to that of the second flattening film 104, for example.

Configurations of Contact Holes CH2 and CH3

Figure 4:
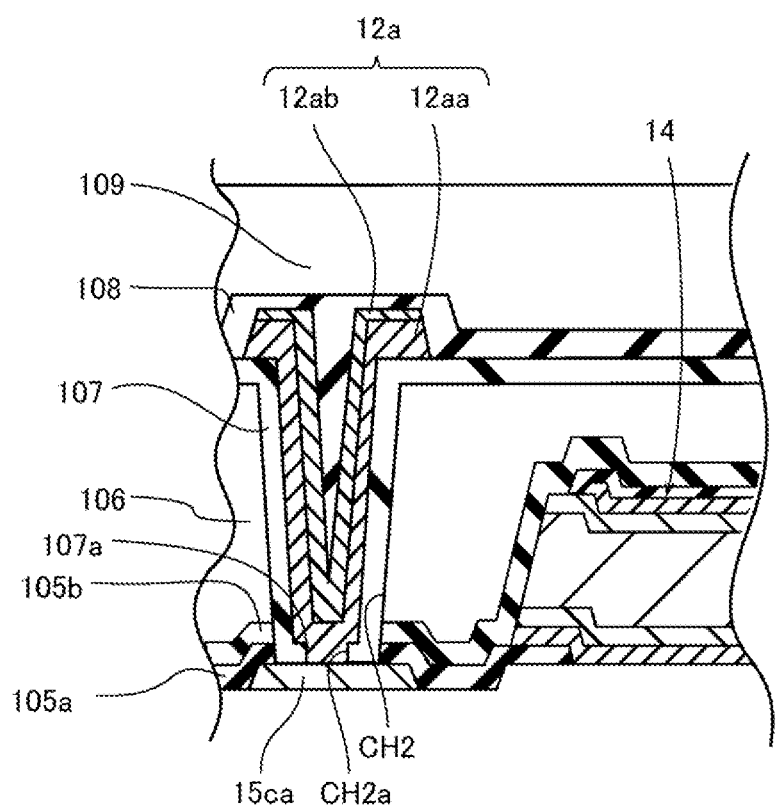
FIG. 4 is a view for describing a configuration of a contact hole CH2 and films disposed in the contact hole CH2.
Figure 5:
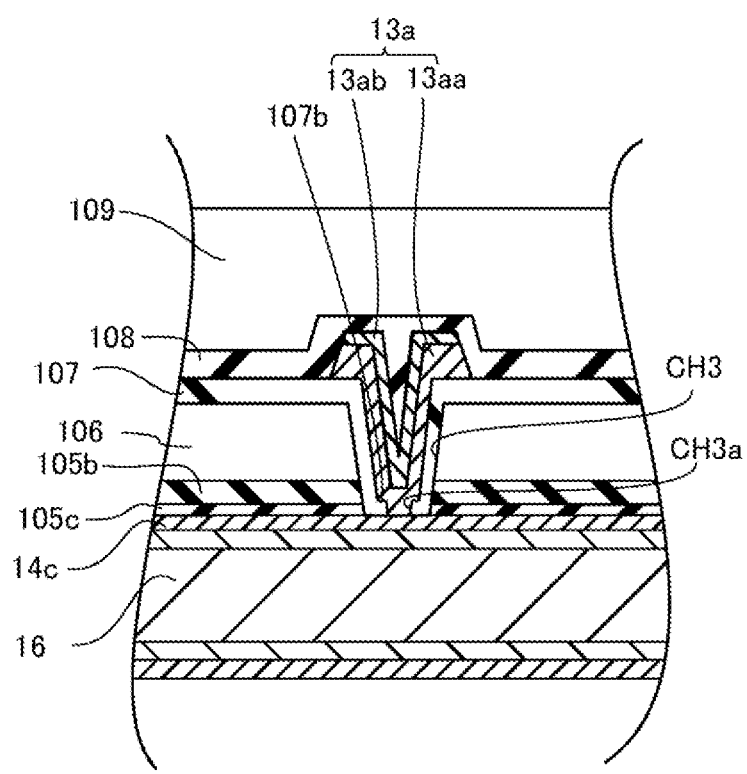
FIG. 5 is a view for describing a configuration of a contact hole CH3 and films disposed in the contact hole CH3.

FIG. 4 is a view for describing a configuration of the contact hole CH2 and films disposed in the contact hole CH2. FIG. 5 is a view for describing a configuration of the contact hole CH3 and films disposed in the contact hole CH3.

As illustrated in FIG. 4, each of the first flattening film 106 and the inorganic insulating films 105*a* and 105*b* includes the contact hole CH2 connected to the source connection electrode 15*ca*. The data line 12*a* disposed in the contact hole CH2 is in contact with an upper face of the source connection electrode 15*ca*. A part of the inorganic insulating film 107 is disposed on the inner side surface of the contact hole CH2 and a part of a base of the contact hole CH2. A portion of the inorganic insulating film 107 disposed in the contact hole CH2 includes a contact hole CH2*a*. Thus, a step portion 107*a* is formed between the source connection electrode 15*ca* and an upper face of the inorganic insulating film 107.

As illustrated in FIG. 5, each of the first flattening film 106 and the inorganic insulating films 105*b* and 105*c* includes contact hole CH3 connected to the anode 14c. The bias line 13a disposed in the contact hole CH3 is in contact with an upper face of the anode 14c. A part of the inorganic insulating film 107 is disposed on the inner side surface of the contact hole CH3 and a part of a base of the contact hole CH3. A portion of the inorganic insulating film 107 disposed in the contact hole CH3 includes a contact hole CH3a. Thus, a step portion 107b is formed between the anode 14c and an upper face of the inorganic insulating film 107. According to this configuration, when the photoelectric conversion panel 1 is manufactured, steps S13 and S14 (steps of forming the contact holes CH2 and CH3) to be described later and step S15 (contact holes CH2a and CH3b) to be described later can be performed in different steps, and thus a burden due to etching can be dispersed for each step as compared with a case where the contact holes are formed in the inorganic insulating films 105a to 105c and the inorganic insulating film 107 at one time. As a result, even when the first flattening film 106 that covers the photodiode 14 is provided, a contact failure or an increase in contact resistance between the bias line 13a and the photodiode 14 in the contact holes CH2 and CH3 can be prevented. The step portions 107a and 107b can prevent the bias line 13a or data line 12a from entering an unnecessarily cut portion. As a result, a decrease in film thicknesses of the bias line 13a and the data line 12a can be prevented, the contact resistance between the bias line 13a and the photodiode 14 can be reduced, and the contact resistance between the data line 12a and the source connection electrode 15ca can be reduced.

Configuration of Terminal Region R2

Figure 6:
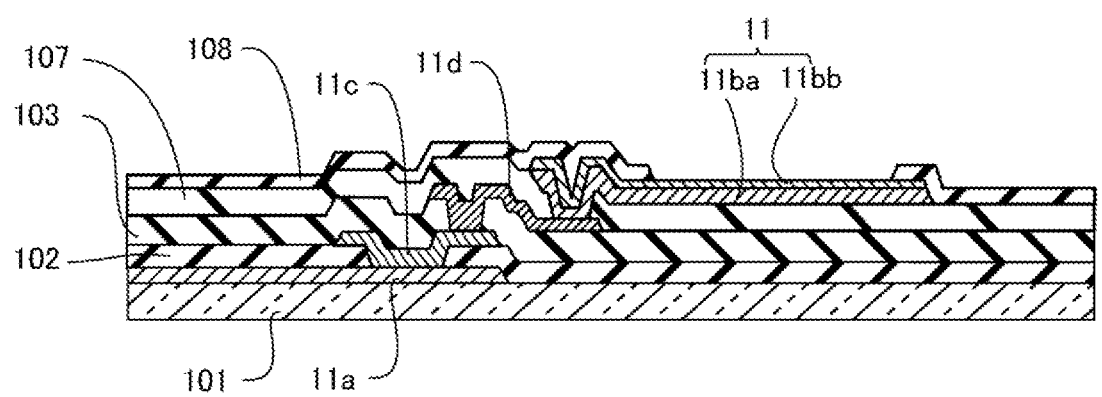
FIG. 6 is a cross-sectional view of a gate terminal 11 and near the gate terminal 11.
Figure 7:
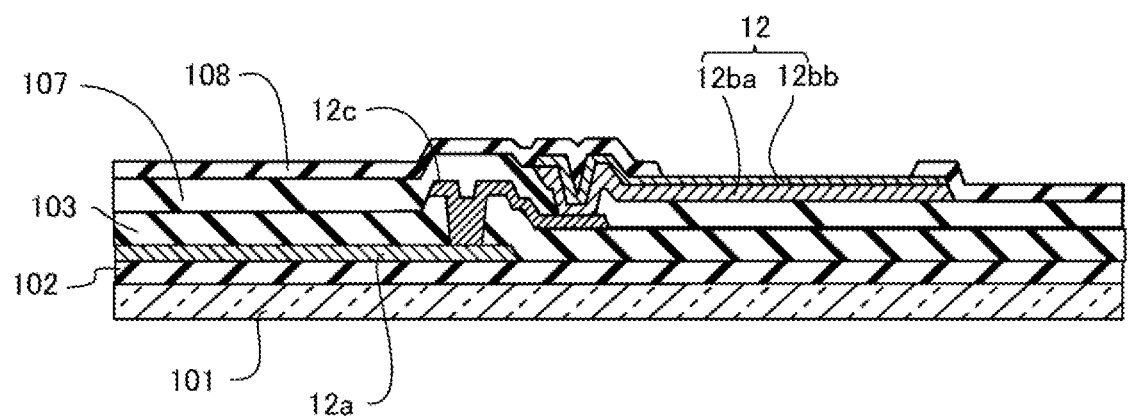
FIG. 7 is a cross-sectional view of a data terminal 12 and a vicinity of the data terminal 12.

Next, a configuration of the terminal region R2 according to the first embodiment will be described. FIG. 6 is a cross-sectional view of the gate terminal 11 and near the gate terminal 11. FIG. 7 is a cross-sectional view of the data terminal 12 and a vicinity of the data terminal 12.

As illustrated in FIG. 6, the gate terminal 11 includes a gate terminal lower electrode 11ba formed in the same layer as the layer in which the bias lower electrode 13aa is formed, and a gate terminal upper electrode 11bb formed in the same layer as the layer in which the bias upper electrode 13ab is formed. The gate terminal lower electrode 11ba and the gate terminal upper electrode 11bb are layered. The gate line 11a is formed in the same layer as the layer in which the gate electrode 15a is formed. In the terminal region R2, the gate terminal connection electrodes 11c and 11d disposed between the gate line 11a and the gate terminal 11 are provided. The gate terminal connection electrode 11c is formed in the same layer as the layer in which the source electrode 15c is formed, and is connected to the gate line 11a. The gate terminal connection electrode 11d is formed in the same layer as the layer in which the cathode connection electrode 14a is formed, and is connected to the gate terminal connection electrode 11c and the gate terminal 11. Note that in the first embodiment, a portion in which the gate terminal 11 is exposed, and the gate terminal connection electrodes 11c and 11d, are disposed so as not to overlap with each other in a plan view.

As illustrated in FIG. 7, the data terminal 12 includes a data terminal lower electrode 12ba formed in the same layer as the layer in which the bias lower electrode 13aa is formed, and a data terminal upper electrode 12bb formed in the same layer as the layer in which the bias upper electrode 13ab is formed. The data terminal lower electrode 12ba and the data terminal upper electrode 12bb are layered. In the terminal region R2, the data line 12a is formed in the same layer as the layer in which the source electrode 15c is formed. In the terminal region R2, a data terminal connection electrode 12c disposed between the data line 12a and the data terminal 12 is provided. The data terminal connection electrode 12c is formed in the same layer as the layer in which the cathode connection electrode 14a is formed, and is connected to the data line 12a and the data terminal 12. Note that in the first embodiment, a portion in which the data terminal 12 is exposed, and the data terminal connection electrode 12c, are disposed so as not to overlap with each other in a plan view.

Figure 8:
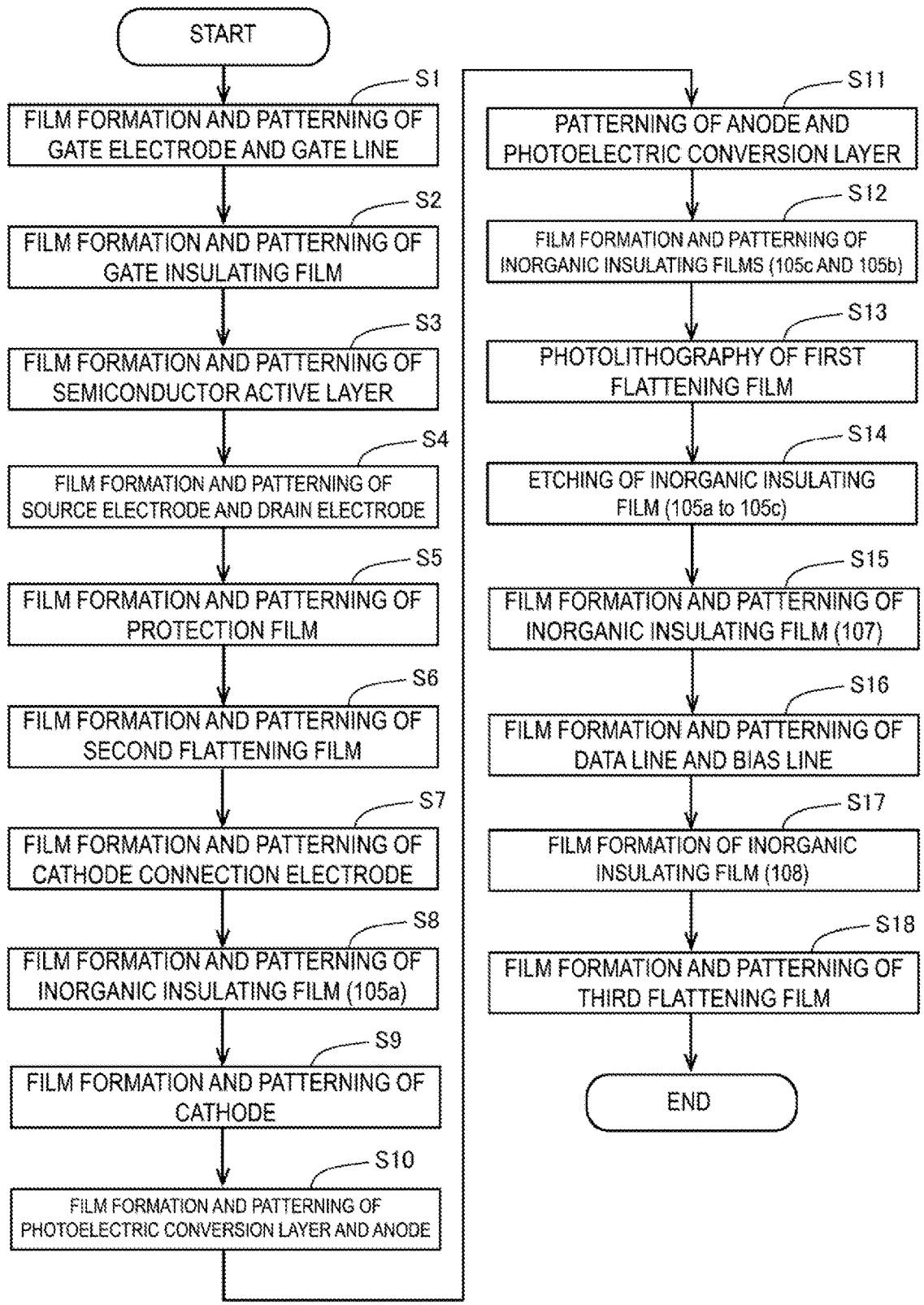
FIG. 8 is a flowchart for describing a manufacturing process of the photoelectric conversion panel 1.

Manufacturing Method of Photoelectric Conversion Panel According to First Embodiment Next, a manufacturing method of the photoelectric conversion panel 1 according to the first embodiment will be described with reference to FIG. 8. FIG. 8 is a flowchart for describing a manufacturing process of the photoelectric conversion panel 1.

As illustrated in FIG. 8, in step S1, in the pixel region R1, the gate electrode 15a (see FIG. 3) is subjected to film formation on the substrate 101, and is patterned. In this step S1, in the terminal region R2, the gate line 11a (see FIG. 6) is subjected to film formation on the substrate 101, and is patterned.

In step S2, the gate insulating film 102 is subjected to film formation so as to cover the gate electrode 15a and the gate line 11a, and is patterned. Then, in step S3, in the pixel region R1, the semiconductor active layer 15b (see FIG. 3) is subjected to film formation on the gate insulating film 102, and is patterned.

In step S4, in the pixel region R1, the source electrode 15c and the drain electrode 15d are subjected to film formation on the gate insulating film 102, and are patterned. Thus, the thin film transistor 15 is formed. In this step S4, in the terminal region R2, the gate terminal connection electrode 11c (see FIG. 6) and the data line 12a are formed on the gate insulating film 102.

In step S5, in the pixel region R1, the protection film 103 is subjected to film formation on the gate insulating film 102 so as to cover the source electrode 15c and the drain electrode 15d, and is patterned. In step S6, the second flattening film 104 is subjected to film formation on the protection film 103. In this step S6, in the pixel region R1, the contact hole CH1 (see FIG. 3) is formed in the second flattening film 104.

In step S7, in the pixel region R1, the cathode connection electrode 14a is subjected to film formation on the second flattening film 104 and in the contact hole CH1, and is patterned. Thus, the cathode connection electrode 14a and the drain electrode 15d are connected to each other. In the terminal region R2, the gate terminal connection electrode 11d and the data terminal connection electrode 12c are formed.

In step S8, the inorganic insulating film 105a is subjected to film formation so as to cover a part of the cathode connection electrode 14a and the source connection electrode 15ca, and is patterned. Then, in step S9, in the pixel region R1, the cathode 14b (see FIG. 3) of the photodiode 14 is subjected to film formation on a part of the inorganic insulating film 105a and on the cathode connection electrode 14a, and is patterned.

In step S10, in the pixel region R1, the photoelectric conversion layer 16 (see FIG. 3) is subjected to film formation. Specifically, the n-type amorphous semiconductor layer 161, the intrinsic amorphous semiconductor layer 162, and the p-type amorphous semiconductor layer 163 are sequentially layered. Then, the anode 14c is subjected to film formation. In step S11, the anode 14c and the photoelectric conversion layer 16 are patterned. In step S12, the inorganic insulating film 105c is subjected to film formation so as to cover the anode 14c, and is patterned. Further, the inorganic insulating film 105b is subjected to film formation so as to cover the photodiode 14 and the inorganic insulating films 105a and 105c, and is patterned.

Figure 9:
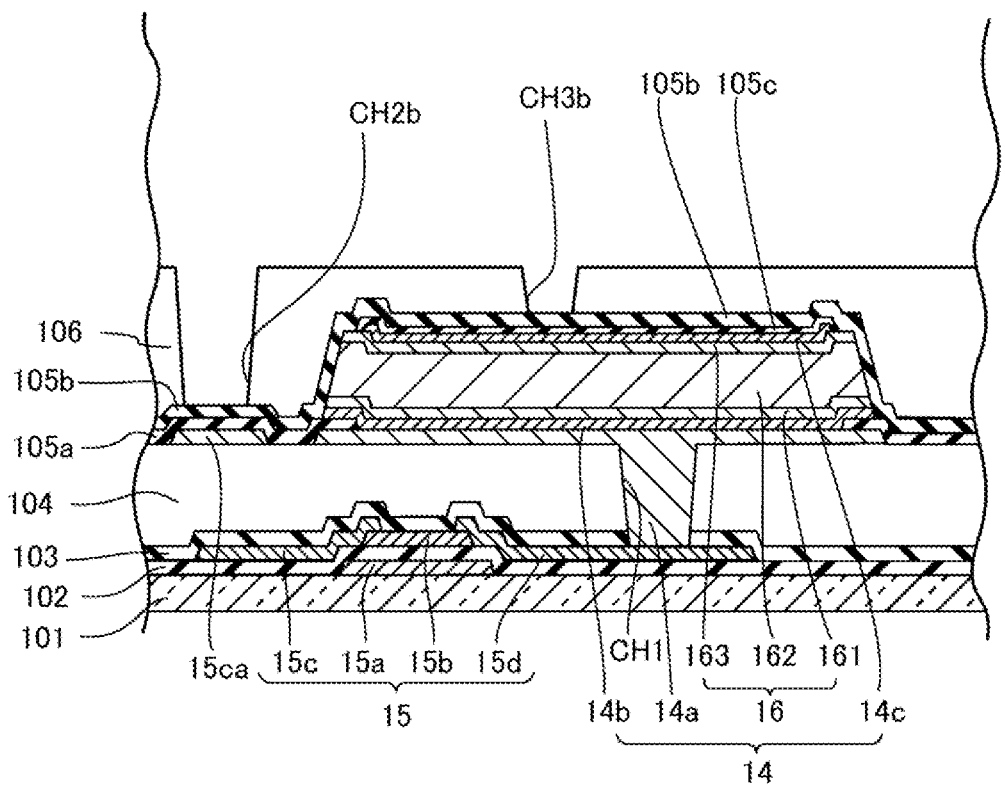
FIG. 9 is a cross-sectional view for describing formation of a first flattening film 106.

FIG. 9 is a cross-sectional view for describing formation of the first flattening film 106. In step S13, as illustrated in FIG. 9, the first flattening film 106 is subjected to film formation so as to cover the inorganic insulating film 105b, and the contact hole CH2b and the contact hole CH3b are formed by photolithography.

Figure 10:
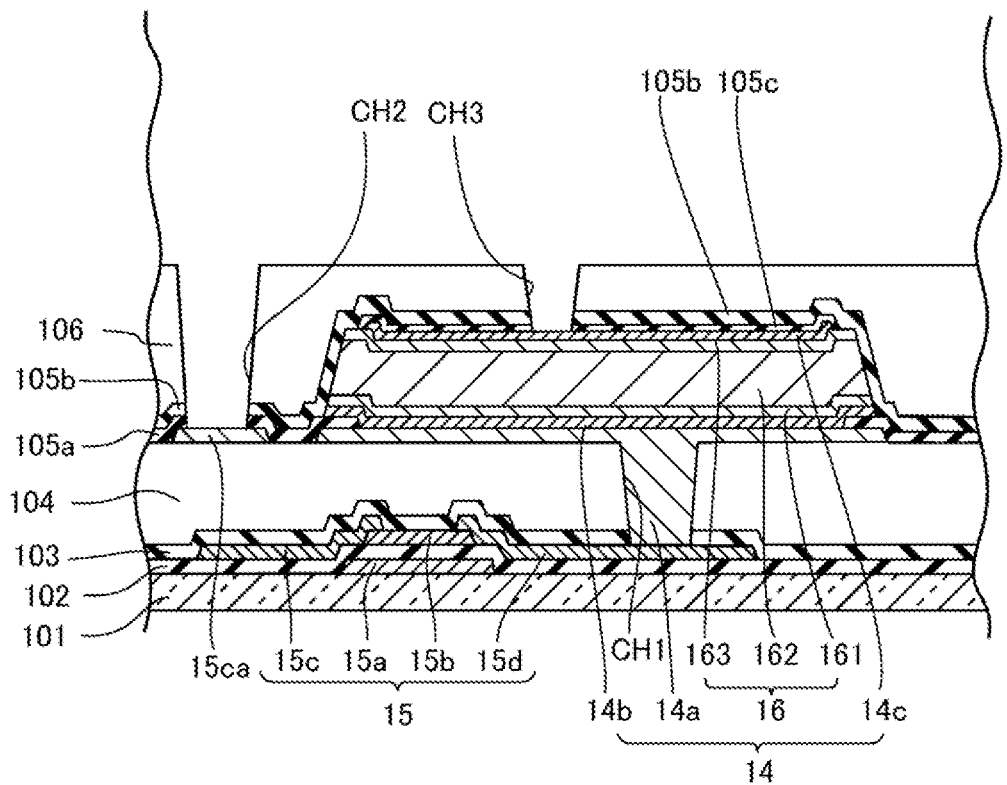
FIG. 10 is a view for describing etching of inorganic insulating films 105a to 105c.

FIG. 10 is a view for describing etching of the inorganic insulating films 105a to 105c. In step S14, as illustrated in FIG. 10, etching is performed on the inorganic insulating films 105a to 105c, forming the contact hole CH2 and the contact hole CH3 in the inorganic insulating films 105a to 105c. For example, dry etching is performed using the first flattening film 106 as a mask to form the contact hole CH2 and the contact hole CH3. Thereafter, cleaning (peeling or water washing) is performed. By forming the contact hole CH2, a part of the upper face of the source connection electrode 15ca is exposed, and by forming the contact hole CH3, a part of the upper face of the anode 14c is exposed.

Figure 11:
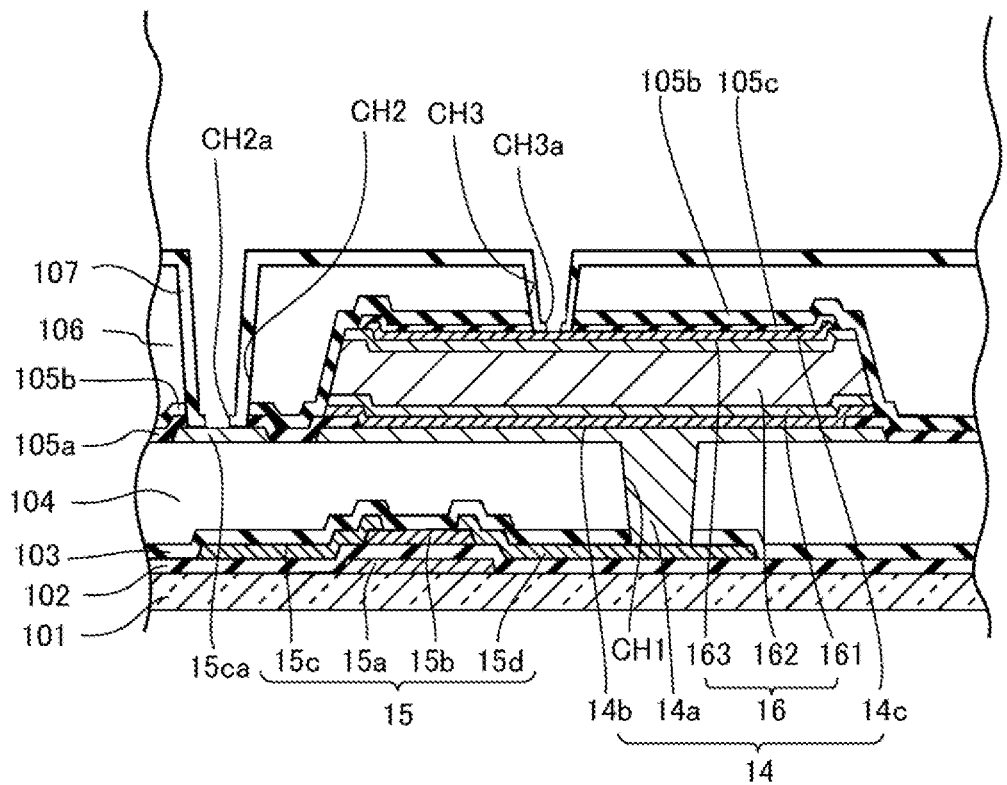

FIG. 11 is a view for describing formation of the contact holes CH2a and CH3a. In step S15, the inorganic insulating film 107 is subjected to film formation on the first flattening film 106, in the contact hole CH2, and in the contact hole CH3, and is patterned. In this step S15, as illustrated in FIG. 11, the contact hole CH2a is formed in a portion of the inorganic insulating film 107 disposed in the contact hole CH2, and the contact hole CH3a is formed in a portion of the inorganic insulating film 107 disposed in the contact hole CH3. As a result, in the contact hole CH2, the step portion 107a is formed between the source connection electrode 15ca and the upper face of the inorganic insulating film 107, and in the contact hole CH3, the step portion 107b is formed between the upper face of the photodiode 14 and the upper face of the inorganic insulating film 107. The step portions 107a and 107b can prevent the bias line 13a or data line 12a from entering the unnecessarily cut portion. As a result, a decrease in film thicknesses of the bias line 13a and the data line 12a can be prevented, the contact resistance between the bias line 13a and the photodiode 14 can be reduced, and the contact resistance between the data line 12a and the source connection electrode 15ca can be reduced.

In step S16, films that are to be the data lower electrode 12aa, the bias lower electrode 13aa, the gate terminal lower electrode 11ba, and the data terminal lower electrode 12ba are subjected to film formation on the inorganic insulating film 107, and films that are to be the data upper electrode 12ab, the bias upper electrode 13ab, the gate terminal upper electrode 11bb, and the data terminal upper electrode 12bb are subjected to film formation on the films that are to be the data lower electrode 12aa, the bias lower electrode 13aa, the gate terminal lower electrode 11ba, and the data terminal lower electrode 12ba, and are patterned.

In step S17, the inorganic insulating film 108 is subjected to film formation on the first flattening film 106 so as to cover the data line 12a and the bias line 13a, and is patterned. In step S18, the third flattening film 109 is subjected to film formation so as to cover the inorganic insulating film 108, and is patterned. This completes the photoelectric conversion panel 1. Thereafter, the X-ray panel 10 is completed by being combined with the scintillator 2. Note that the X-ray imaging device 100 is completed by attaching a flexible printed circuit board (not illustrated) from the control unit 3 to the gate terminal 11, the data terminal 12, and the bias terminal 13.

According to the above-described method, steps S13 and S14 (steps of forming the contact holes CH2 and CH3) and step S15 (contact holes CH2a and CH3b) are performed in different steps, and thus the burden due to etching can be dispersed for each step as compared with the case where the contact holes are formed in the inorganic insulating films 105a to 105c and the inorganic insulating film 107 at one time. As a result, even when the first flattening film 106 that covers the photodiode 14 is provided, a contact failure or an increase in contact resistance between the bias line 13a and the photodiode 14 in the contact holes CH2 and CH3 can be prevented.

Second Embodiment

Figure 12:
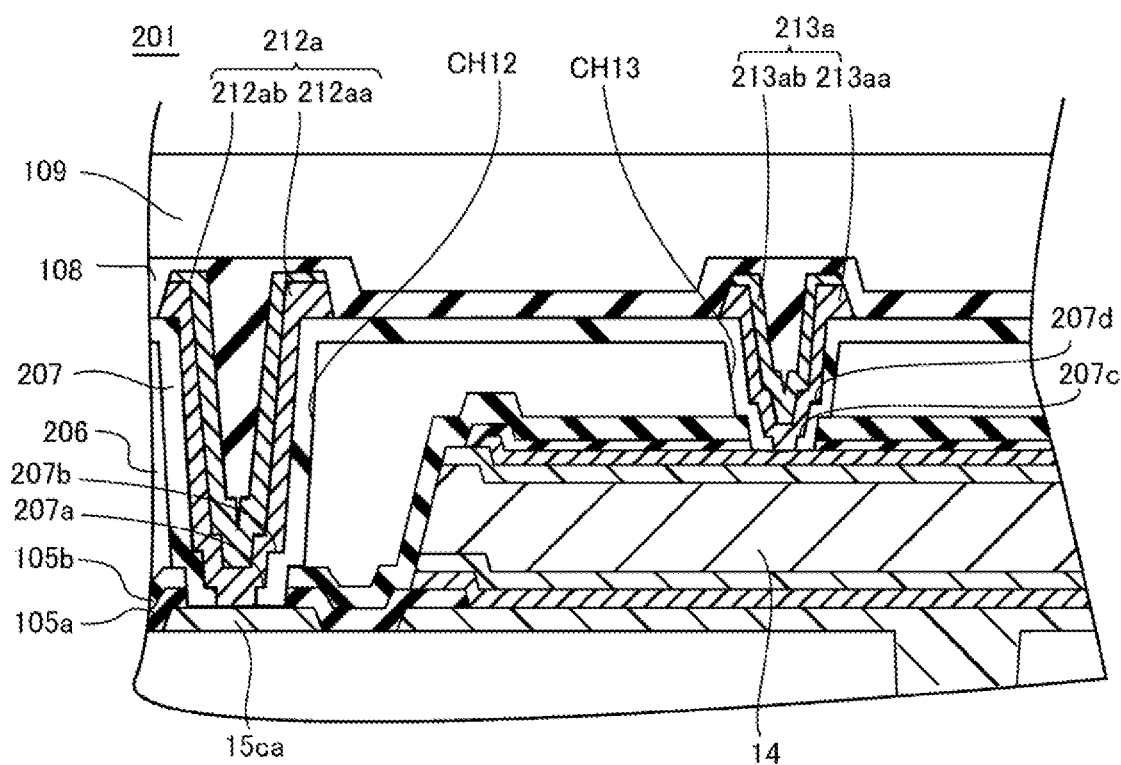
FIG. 12 is a partial cross-sectional view of a photoelectric conversion panel 201 according to a second embodiment.

A configuration of a photoelectric conversion panel 201 according to a second embodiment will be described with reference to FIG. 12. FIG. 12 is a partial cross-sectional view of the photoelectric conversion panel 201 according to the second embodiment. Note that the same configurations as those of the first embodiment will be denoted by the same reference signs as those of the first embodiment, and descriptions thereof will be omitted.

As illustrated in FIG. 12, the photoelectric conversion panel 201 according to the second embodiment includes a first flattening film 206 in which contact holes CH12 and CH13 are formed, and an inorganic insulating film 207 formed on the first flattening film 206, a part of the inorganic insulating film 207 being disposed in the contact holes CH12 and CH13. In the inorganic insulating film 207, two step portions 207a and 207b are formed in the contact hole CH12, and two step portions 207c and 207c are formed in the contact hole CH13. A portion of the first flattening film 206 which forms the inner side surface of the contact hole CH12 is located outside a portion of the inorganic insulating films 105a and 105b which forms the inner side surface of the contact hole CH12. Further, a portion of the first flattening film 206 which forms the inner side surface of the contact hole CH13 is located outside a portion of the inorganic insulating films 105b and 105c which forms the inner side surface of the contact hole CH13. Other configurations and effects are similar to those in the first embodiment.

Manufacturing Method According to Second Embodiment

Figure 13:
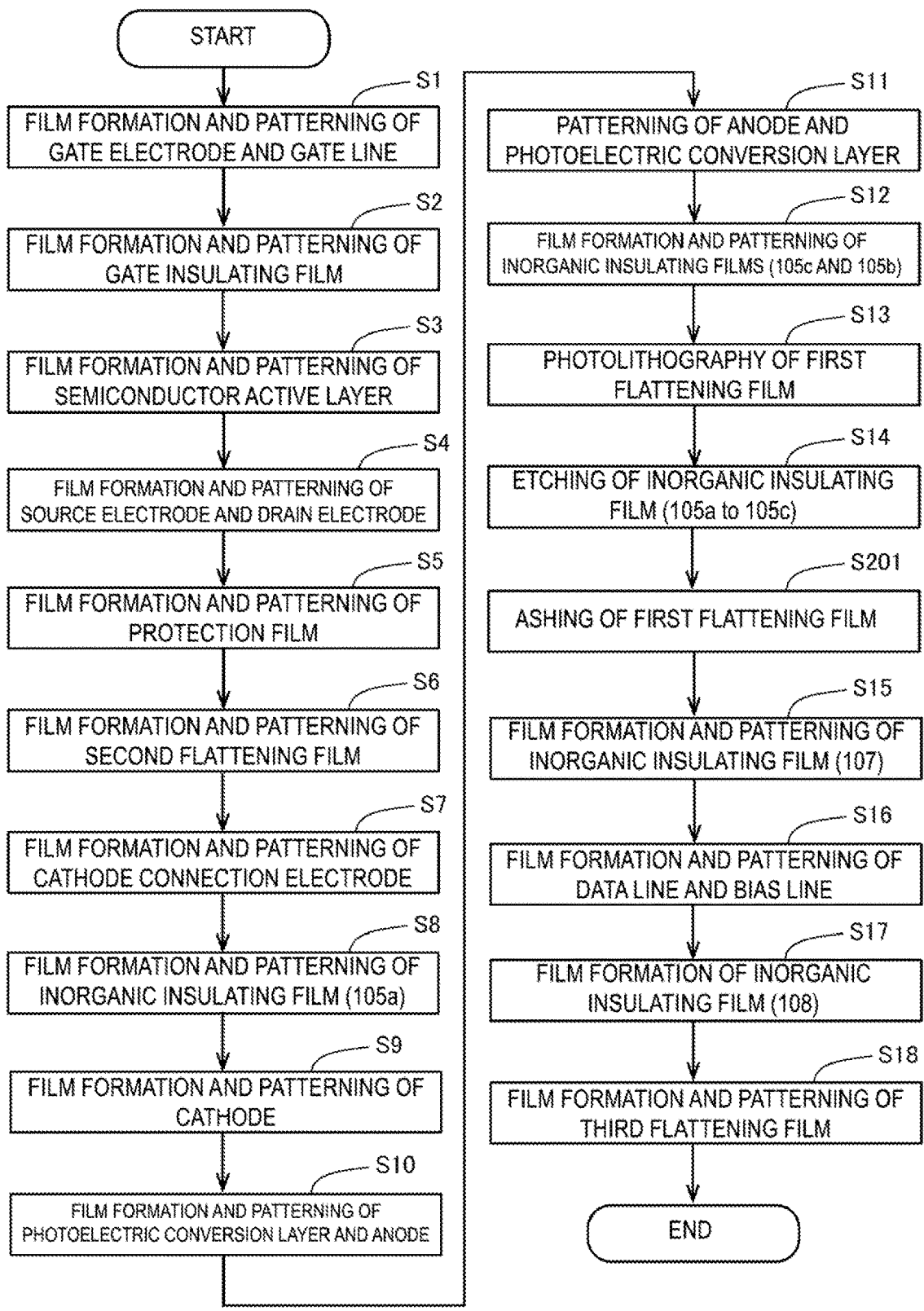
FIG. 13 is a flowchart illustrating a manufacturing process of the photoelectric conversion panel 201 according to the second embodiment.

Next, a manufacturing method of the photoelectric conversion panel 201 according to the second embodiment will be described with reference to FIG. 13. FIG. 13 is a flowchart illustrating a manufacturing process of the photoelectric conversion panel 201 according to the second embodiment. Note that the same steps as those of the first embodiment will be denoted by the same step numbers as those of the first embodiment, and descriptions thereof will be omitted.

Figure 14:
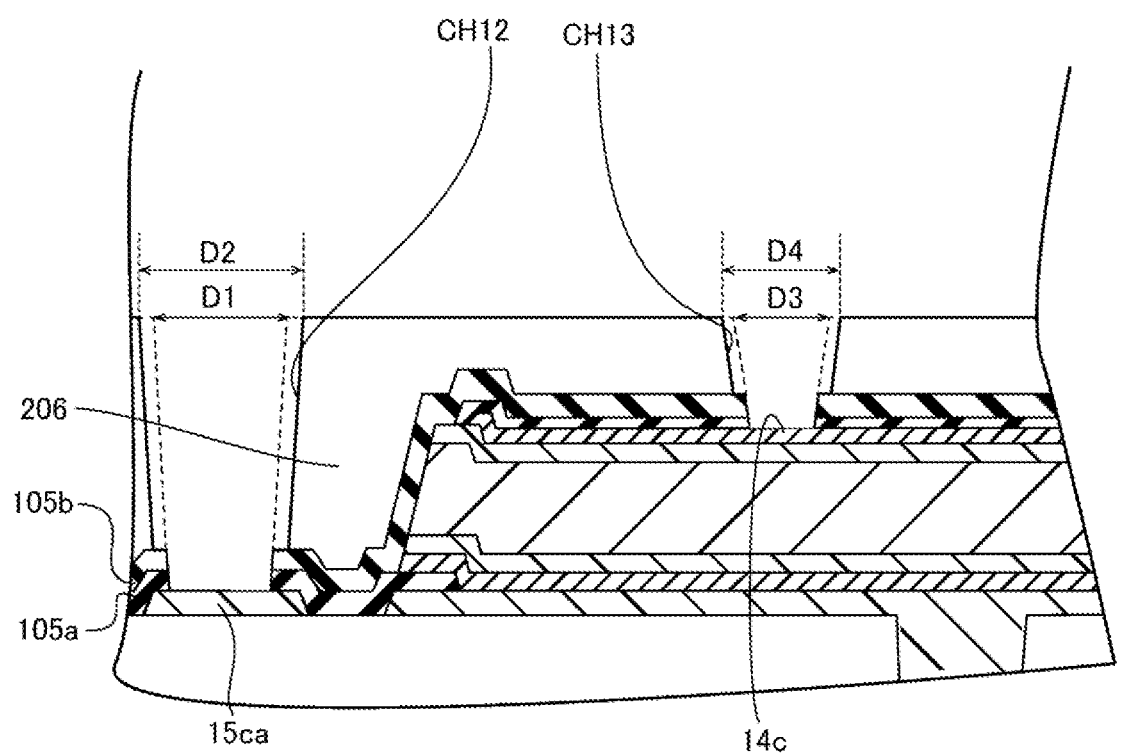
FIG. 14 is a view for describing asking of a first flattening film 206 according to the second embodiment.

As illustrated in FIG. 13, in the manufacturing process of the photoelectric conversion panel 201 according to the second embodiment, after step S14 and before step S15, step 201 is added to the first embodiment, and in step 201, ashing of the first flattening film 206 is performed. FIG. 14 is a view for describing the ashing of the first flattening film 206 according to the second embodiment. As illustrated in FIG. 14, by irradiating the contact holes CH12 and CH13 in the first flattening film 206 with, for example, oxygen plasma, the first flattening film 206 recedes from a dotted line portion toward a solid line portion. As a result, a diameter D1 of the contact hole CH12 is enlarged to a diameter D2, and a diameter D3 of the contact hole CH13 is enlarged to a diameter D4. Note that "diameter" refers to the diameter when the contact hole is circular, refers to the length of the major axis when the contact hole is elliptical, and refers to the length of one side (long side) when the contact hole is rectangular.

Here, in a case where alignment deviates when the contact hole is formed, the first flattening film may be exposed and the bias line or the data line may come into contact with the first flattening film (organic film). In a case where the bias lower electrode or the data lower electrode made of Ti contacts with the first flattening film, there is no problem, but in a case where the bias lower electrode or the data lower electrode does not cover the inside of the contact hole and the first flattening film contacts with the bias upper electrode or the data upper electrode made of Al, the bias upper electrode or the data upper electrode made of Al deteriorates due to moisture from the first flattening film. On the other hand, according to the manufacturing method of the second embodiment, since the diameters of the contact holes CH12 and CH13 are enlarged, an allowable range of deviation of the alignment can be extended. As a result, the bias lower electrode 213aa, the data lower electrode 212aa, the bias upper electrode 213ab, and the data upper electrode 212ab are prevented from contacting with the first flattening film 206. As a result, the deterioration of the bias upper electrode 213ab and the data upper electrode 212ab can be prevented. In addition, since the two step portions 207a and 207b are formed in the contact hole CH12 and the two step portions 207c and 207c are formed in the contact hole CH13, the bias line 213a and the data line 212a can be prevented from entering the unnecessarily cut portion. As a result, a decrease in film thicknesses of the bias line 213a and the data line 212a can be prevented, the contact resistance between the bias line 213a and the photodiode 14 can be reduced, and the contact resistance between the data line 212a and the source connection electrode 15ca can be reduced. Other manufacturing methods and effects are similar to those in the first embodiment.

Third Embodiment

Figure 15:
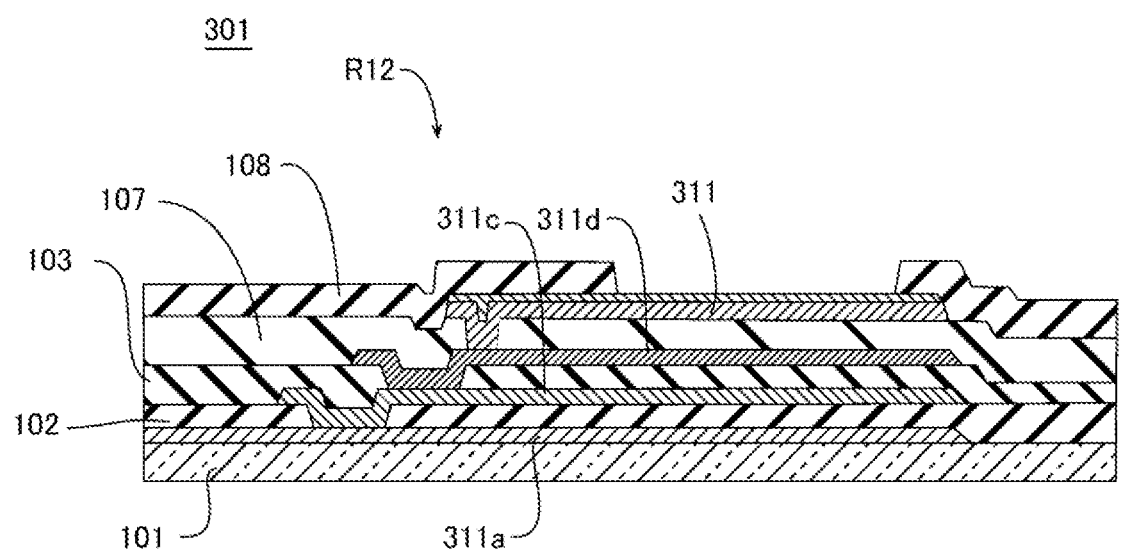
FIG. 15 is a cross-sectional view (1) of a terminal region R12 of a photoelectric conversion panel 301 according to a third embodiment.
Figure 16:
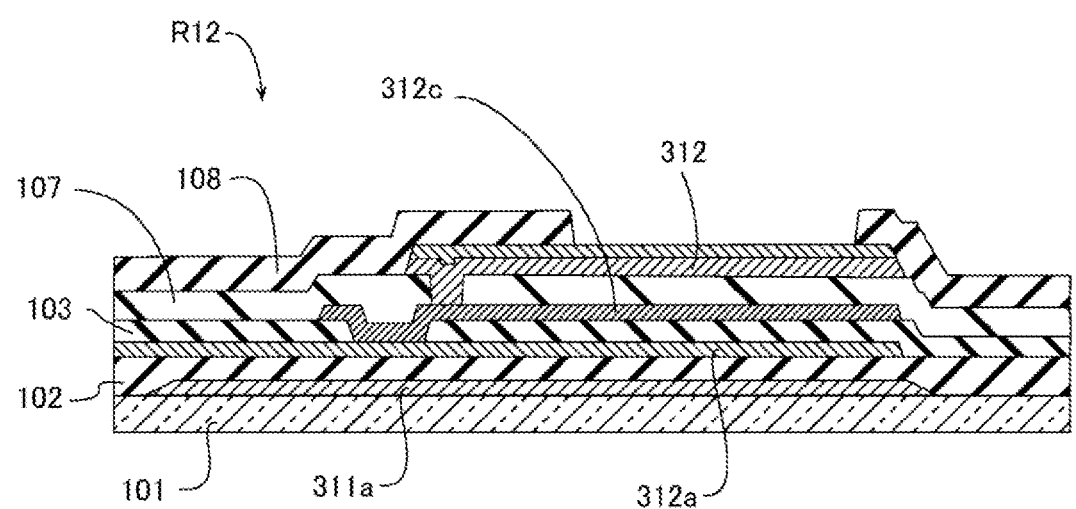
FIG. 16 is a cross-sectional view (2) of the terminal region R12 of the photoelectric conversion panel 301 according to the third embodiment.

A configuration of a photoelectric conversion panel 301 according to a third embodiment will be described with reference to FIGS. 15 and 16. FIGS. 15 and 16 are cross-sectional views of a terminal region R12 of the photoelectric conversion panel 301 according to the third embodiment. Note that the same components as those of the first or second embodiment will be denoted by the same reference signs as the reference signs of the first or second embodiment, and descriptions thereof will be omitted.

As illustrated in FIG. 15, the photoelectric conversion panel 301 according to the third embodiment includes a gate line 311a formed at a position overlapping with a gate terminal 311 in a plan view, and gate terminal connection electrodes 311c and 311d each formed at a position overlapping with the gate terminal 311 in a plan view. As illustrated in FIG. 16, the photoelectric conversion panel 301 according to the third embodiment includes a data line 312a and the gate line 311a each formed at a position overlapping with a data terminal 312 in a plan view, and a data terminal connection electrode 312c formed at a position overlapping with the data terminal 312 in a plan view. Although not illustrated, the photoelectric conversion panel 301 according to the third embodiment includes a bias line, a gate line, and a data line each formed at a position overlapping with the bias terminal in a plan view. Here, although the flattening film is not provided in the terminal region R12, a difference between a height position of the gate terminal 311 and the data terminal 312 from the substrate 101 and a height position of a region other than the terminal region in which the flattening film is provided can be reduced. As a result, when the flexible printed circuit board is connected to the gate terminal 311 and the data terminal 312, poor crimping and fixing of the gate terminal 311 and the data terminal 312 to the flexible printed circuit board can be prevented. Further, at the time of inspection, an inspection probe can be easily brought into contact with the gate terminal 311 and the data terminal 312. Other configurations and effects are similar to those in the first or second embodiment.

Manufacturing Method According to Third Embodiment

Figure 17:
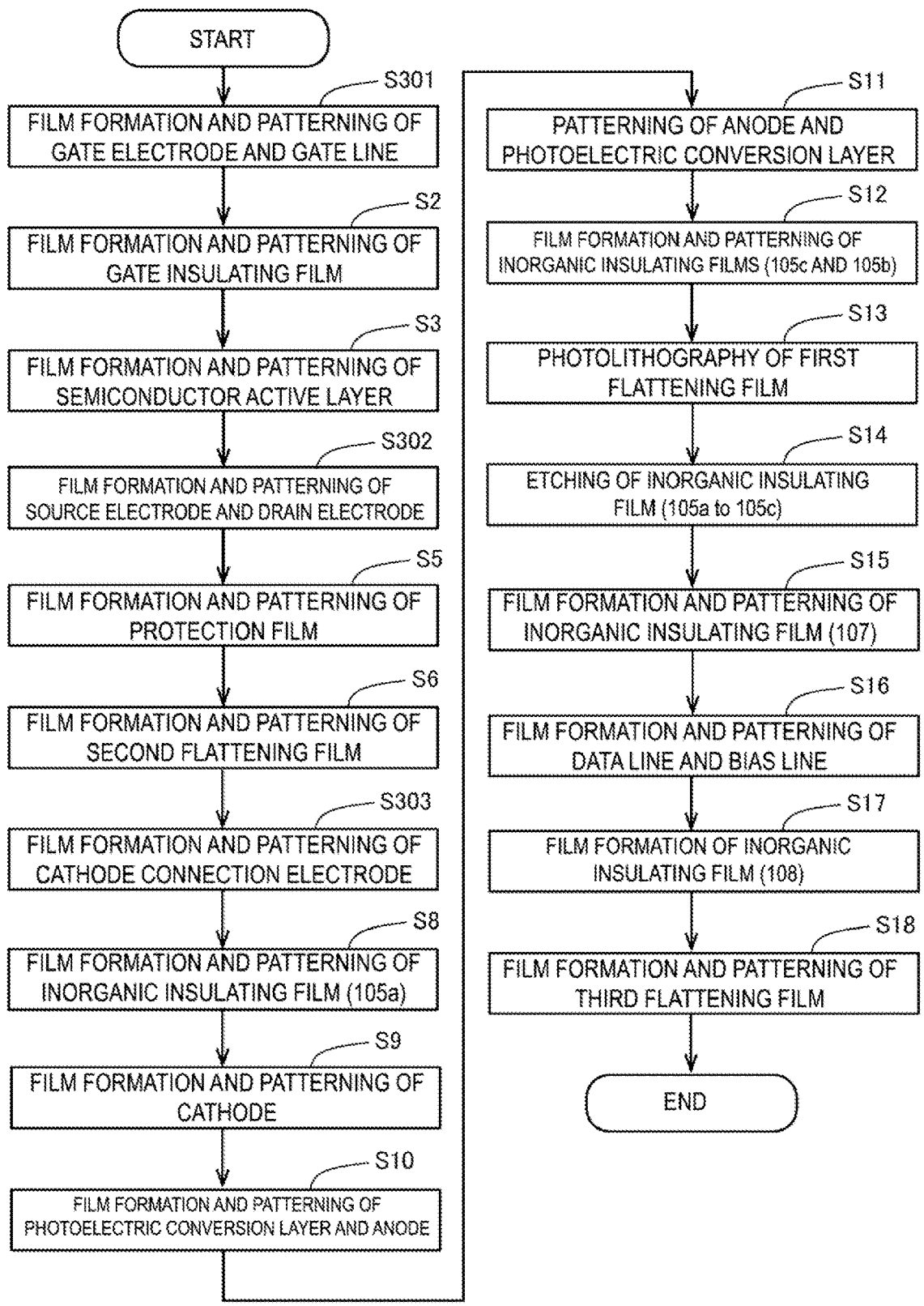
FIG. 17 is a flowchart illustrating a manufacturing process of the photoelectric conversion panel 301 according to the third embodiment.

Next, a manufacturing method of the photoelectric conversion panel 301 according to a third embodiment will be described with reference to FIG. 17. FIG. 17 is a flowchart illustrating a manufacturing process of the photoelectric conversion panel 301 according to the third embodiment. Note that the same steps as those of the first embodiment will be denoted by the same step numbers as those of the first embodiment, and descriptions thereof will be omitted.

As illustrated in FIG. 17, in the manufacturing process of the photoelectric conversion panel 301 in the third embodiment, steps S301 to S303 are executed instead of steps S1, S4, and S7 in the first embodiment. In step S301, in the pixel region R1, the gate electrode 15a (see FIG. 3) is subjected to film formation on the substrate 101, and is patterned. Further, in this step S301, in the terminal region R12, the gate line 311a is subjected to film formation on the substrate 101 at a position overlapping with a position where each of the gate terminal 311 and the data terminal 312 are formed in a plan view, and is patterned. In step S302, in the pixel region R1, the source electrode 15c and the drain electrode 15d are subjected to film formation on the gate insulating film 102, and are patterned. In this step S302, in the terminal region R12, the gate terminal connection electrode 311c and the data line 312a are formed on the gate insulating film 102 at positions overlapping with positions where the gate terminal 311 and the data terminal 312 are formed, respectively, in a plan view. In step S303, in the pixel region R1, the cathode connection electrode 14a is subjected to film formation on the second flattening film 104 and in the contact hole CH1, and is patterned. In the terminal region R12, the gate terminal connection electrode 311d and data terminal connection electrode 312c are formed at positions overlapping with positions where the gate terminal 311 and the data terminal 312 are formed, respectively, in a plan view. Other manufacturing methods and effects are similar to those in the first and second embodiments.

Embodiments have been described above, but the embodiments described above are merely examples for implementing the disclosure. Thus, the disclosure is not limited to the embodiments described above and can be implemented by modifying the embodiments described above as appropriate without departing from the scope of the disclosure.

Figure 18:
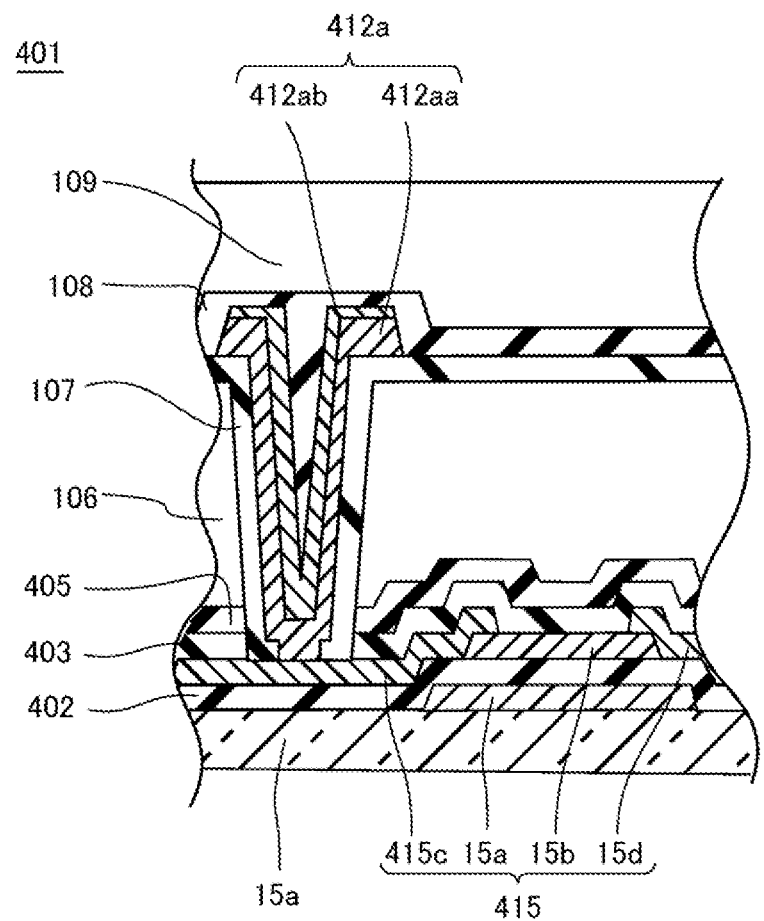
FIG. 18 is a cross-sectional view illustrating a configuration of a photoelectric conversion panel 401 according to a modified example of the first to third embodiments.

(1) In the first to third embodiments described above, examples are illustrated in which the second flattening film 104 is provided in the photoelectric conversion panel, but the disclosure is not limited to these examples. For example, as in a photoelectric conversion panel 401 according to a modified example illustrated in FIG. 18, the first flattening film 106 may be formed on a thin film transistor 415 without providing the second flattening film 104. In this case, a data line 412a includes a data lower electrode 412aa and a data upper electrode 412ab, and the data line 412a is connected to a source electrode 415c of the thin film transistors 415. The data lower electrode 412aa is in contact with the source electrode 415c.

(2) In the first to third embodiments described above, examples are illustrated in which the photoelectric conversion panel is applied to the X-ray panel for the X-ray imaging device, but the disclosure is not limited to these examples. That is, the photoelectric conversion panel described above may be applied to a panel for an optical sensor other than X-rays.

(3) In the first to third embodiments described above, examples of the materials of the layers (films) constituting the photoelectric conversion panel are illustrated, but the disclosure is not limited to these examples. That is, the layers (films) constituting the photoelectric conversion panel may be formed by materials other than the examples described above.

(4) In the first to third embodiments described above, examples are illustrated in which the data line, bias line, data terminal, and gate terminal are each constituted by a film of two layers, but the disclosure is not limited to these examples. That is, the data line, bias line, data terminal, and gate terminal may each be constituted by a single layer, or may each be constituted by a film of three or more layers.

The manufacturing method of the photoelectric conversion panel, the photoelectric conversion panel, and the X-ray panel described above may also be described as follows.

A manufacturing method of a photoelectric conversion panel according to a first configuration is a manufacturing method including forming a transistor on a substrate, forming a photodiode at an upper layer overlying the transistor, forming a first insulating film that covers the photodiode, forming a first flattening film that covers the first insulating film, forming a first hole portion that exposes a part of an upper face of the photodiode in the first flattening film and the first insulating film, forming a second hole portion that exposes a source electrode of the transistor or a connection electrode connected to the source electrode in the first flattening film and the first insulating film, forming a second insulating film that covers the first flattening film, a part of the second insulating film being disposed in each of the first hole portion and the second hole portion, forming a third hole portion in the second insulating film disposed in the first hole portion, forming a fourth hole portion in the second insulating film disposed in the second hole portion, forming a bias line at an upper layer overlying the second insulating film, a part of the bias line being disposed in the third hole portion, and forming a data line at an upper layer overlying the second insulating film, a part of the data line being disposed in the fourth hole portion. (first configuration).

According to the first configuration, a step of forming the first hole portion and the second hole portion in the first insulating film and a step of forming the third hole portion and the fourth hole portion in the second insulating film are performed in different steps, and thus a burden due to etching of the first hole portion and the third hole portion can be dispersed for each step as compared with a case where the hole portions are formed in the first insulating film and the second insulating film at one time. As a result, the portion to have been originally left in the first hole portion can be prevented from being removed by etching. As a result, even when the flattening film that covers the photodiode is provided, the contact failure or the increase in contact resistance between the bias line and the photodiode in the first hole portion and the third hole portion can be prevented.

In the first configuration, the forming of the third hole portion may include forming a first step portion between the upper face of the photodiode and an upper face of the second insulating film in the first hole portion, and the forming of the fourth hole portion may include forming a second step portion between the source electrode or the connection electrode and the upper face of the second insulating film in the second hole portion (second configuration).

Here, the first insulating film may be unnecessarily cut by etching in a direction (lateral direction) parallel to the substrate. On the other hand, according to the second configuration, the bias line can be prevented from entering the unnecessarily cut portion by the first step portion formed in the first hole portion. In addition, the data line can be prevented from entering the unnecessarily cut portion by the second step portion formed in the second hole portion. As a result, a decrease in film thicknesses of the bias line and the data line can be prevented, the contact resistance between the bias line and the photodiode can be reduced, and the contact resistance between the data line and the source electrode or the connection electrode can be reduced.

In the first or second configuration, after forming the first hole portion and the second hole portion and before forming the second insulating film, the manufacturing method may further include expanding a diameter of the first hole portion of the first flattening film and expanding a diameter of the second hole portion of the first flattening film (third configuration).

Here, when the third hole portion and the fourth hole portion are formed, positions (alignment) at which the third hole portion and the fourth hole portion are formed may be deviated. In this case, the flattening film is exposed, and moisture and organic components in the flattening film leak to the bias line side or the data line side. As a result, the properties of the bias line, the data line, or the photodiode change, and diode leakage occurs. On the other hand, according to the third configuration, since the diameter of the first hole portion and the diameter of the second hole portion are enlarged, an allowable range of deviation of the alignment can be extended. As a result, diode leakage can be prevented from occurring. Further, since a step is formed between the upper face of the photodiode and the upper face of the first insulating film, in the second insulating film formed on the step, a step is also formed. Accordingly, the bias line and the data line can be prevented from entering the unnecessarily cut portion by the step formed in the second insulating film. As a result, a decrease in film thicknesses of the bias line and the data line can be prevented, the contact resistance between the bias line and the photodiode can be reduced, and the contact resistance between the data line and the source electrode or the connection electrode can be reduced.

In any one of the first to third configurations, the forming of the transistor may include forming a terminal region electrode in a terminal region in which the terminal on the substrate is formed, and the forming of the data line may include forming the data terminal at a position overlapping with the terminal region electrode in a plan view (fourth configuration).

Here, since the flattening film is not provided in the terminal region, a height position of the terminal from the substrate is lower than a height position of a region other than the terminal region in which the flattening film is provided. In this case, when another member (for example, a flexible printed circuit board) is crimped and fixed to the terminal, a part of the other member may come into contact with a region other than the terminal region in which the flattening film is provided, resulting in poor crimping and fixing between the terminal and the other member. On the other hand, according to the fourth configuration, since the height position of the terminal from the substrate can be made higher by forming the terminal region electrode, the difference between the height position of the terminal from the substrate and the height position of the region other than the terminal region in which the flattening film is provided can be reduced. As a result, poor crimping and fixing between the terminal and the other member can be prevented. Further, at the time of inspection, the inspection probe can be easily brought into contact with the terminal.

The photoelectric conversion panel according to a fifth configuration includes a substrate, a transistor formed on the substrate, a photodiode formed at an upper layer overlying the transistor, a first insulating film that covers the photodiode, a first flattening film that covers the first insulating film, a second insulating film that covers the first flattening film, a bias line formed at an upper layer overlying the second insulating film; and a data line formed at an upper layer overlying the second insulating film, in which each of the first flattening film and the first insulating film includes a first hole portion that exposes a part of an upper face of the photodiode and a second hole portion that exposes a source electrode of the transistor or a connection electrode connected to the source electrode, a part of the second insulating film is disposed in each of the first hole portion and the second hole portion, a portion of the second insulating film disposed in the first hole portion includes a third hole portion, and a portion of the second insulating film disposed in the second hole portion includes a fourth hole portion, a part of the bias line is disposed in the third hole portion, and a part of the data line is disposed in the fourth hole portion (fifth configuration).

According to the fifth configuration, a photoelectric conversion panel can be provided, in which even when the flattening film that covers the photodiode is provided, the contact failure or the increase in contact resistance between the bias line and the photodiode can be prevented.

A X-ray panel according to a six configuration includes a scintillator that fluoresces by being irradiated with X-rays, a substrate, a transistor formed on the substrate, a photodiode that converts light from the scintillator into an electric signal, the photodiode being formed at an upper layer overlying the transistor, a first insulating film that covers the photodiode, a first flattening film that covers the first insulating film, a second insulating film that covers the first flattening film, a bias line formed at an upper layer overlying the second insulating film, and a data line formed at an upper layer overlying the second insulating film, in which each of the first flattening film and the first insulating film includes a first hole portion that exposes a part of an upper face of the photodiode and a second hole portion that exposes a source electrode of the transistor or a connection electrode connected to the source electrode, a part of the second insulating film is disposed in each of the first hole portion and the second hole portion, a portion of the second insulating film disposed in the first hole portion includes a third hole portion, a portion of the second insulating film disposed in the second hole portion includes a fourth hole portion, a part of the bias line is disposed in the third hole portion, and a part of the data line is disposed in the fourth hole portion (sixth configuration).

According to the sixth configuration, an X-ray panel can be provided, in which even when the flattening film that covers the photodiode is provided, the contact failure or the increase in contact resistance between the bias line and the photodiode can be prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A manufacturing method of a photoelectric conversion panel comprising:
    forming a transistor on a substrate;
    forming a photodiode at an upper layer overlying the transistor;
    forming a first insulating film configured to cover the photodiode;
    forming a first flattening film configured to cover the first insulating film;
    forming a first hole portion configured to expose a part of an upper face of the photodiode in the first flattening film and the first insulating film;
    forming a second hole portion configured to expose a source electrode of the transistor or a connection electrode connected to the source electrode in the first flattening film and the first insulating film;
    forming a second insulating film configured to cover the first flattening film, a part of the second insulating film being disposed in each of the first hole portion and the second hole portion;
    forming a third hole portion in the second insulating film disposed in the first hole portion;
    forming a fourth hole portion in the second insulating film disposed in the second hole portion;
    forming a bias line at an upper layer overlying the second insulating film, a part of the bias line being disposed in the third hole portion; and
    forming a data line at an upper layer overlying the second insulating film, a part of the data line being disposed in the fourth hole portion.

2. The manufacturing method of a photoelectric conversion panel according to claim 1,
    wherein the forming of the third hole portion includes forming a first step portion between the upper face of the photodiode and an upper face of the second insulating film in the first hole portion, and
    the forming of the fourth hole portion includes forming a second step portion between the source electrode or the connection electrode and the upper face of the second insulating film in the second hole portion.

3. The manufacturing method of a photoelectric conversion panel according to claim 1, further comprising,
    after forming the first hole portion and the second hole portion and before forming the second insulating film, expanding a diameter of the first hole portion of the first flattening film and expanding a diameter of the second hole portion of the first flattening film.

4. The manufacturing method of a photoelectric conversion panel according to claim 1,
    wherein the forming of the transistor includes forming a terminal region electrode in a terminal region in which the terminal on the substrate is formed, and
    the forming of the data line includes forming the data terminal at a position overlapping with the terminal region electrode in a plan view.

5. A photoelectric conversion panel comprising:
    a substrate;
    a transistor formed on the substrate;
    a photodiode formed at an upper layer overlying the transistor;

a first insulating film configured to cover the photodiode;
a first flattening film configured to cover the first insulating film;
a second insulating film configured to cover the first flattening film;
a bias line formed at an upper layer overlying the second insulating film; and
a data line formed at an upper layer overlying the second insulating film,
wherein each of the first flattening film and the first insulating film includes a first hole portion connected to an upper face of the photodiode and a second hole portion connected to a source electrode of the transistor or a connection electrode connected to the source electrode,
a part of the second insulating film is disposed in each of the first hole portion and the second hole portion,
a portion of the second insulating film disposed in the first hole portion includes a third hole portion,
a portion of the second insulating film disposed in the second hole portion includes a fourth hole portion,
a part of the bias line is disposed in the third hole portion, and
a part of the data line is disposed in the fourth hole portion.

6. An X-ray panel comprising:
a scintillator configured to fluoresce by being irradiated with X-rays;
a substrate;
a transistor formed on the substrate;
a photodiode configured to convert light from the scintillator into an electric signal, the photodiode being formed at an upper layer overlying the transistor;
a first insulating film configured to cover the photodiode;
a first flattening film configured to cover the first insulating film;
a second insulating film configured to cover the first flattening film;
a bias line formed at an upper layer overlying the second insulating film; and
a data line formed at an upper layer overlying the second insulating film,
wherein each of the first flattening film and the first insulating film includes a first hole portion connected to an upper face of the photodiode and a second hole portion connected to a source electrode of the transistor or a connection electrode connected to the source electrode,
a part of the second insulating film is disposed in each of the first hole portion and the second hole portion,
a portion of the second insulating film disposed in the first hole portion includes a third hole portion,
a portion of the second insulating film disposed in the second hole portion includes a fourth hole portion,
a part of the bias line is disposed in the third hole portion, and
a part of the data line is disposed in the fourth hole portion.

* * * * *